(12) United States Patent
Kim

(10) Patent No.: US 7,803,677 B2
(45) Date of Patent: Sep. 28, 2010

(54) MANUFACTURING METHOD OF SEMICONDUCTOR DEVICE

(75) Inventor: Cheol Kyun Kim, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 121 days.

(21) Appl. No.: 12/133,751

(22) Filed: Jun. 5, 2008

(65) Prior Publication Data

US 2009/0176340 A1 Jul. 9, 2009

(30) Foreign Application Priority Data

Jan. 7, 2008 (KR) .................. 10-2008-0001890

(51) Int. Cl.
H01L 21/8238 (2006.01)
(52) U.S. Cl. .................. 438/212; 257/E21.418; 438/209
(58) Field of Classification Search .......... 438/212, 438/209, 207, 206; 257/E21.418
See application file for complete search history.

(56) References Cited

U.S. PATENT DOCUMENTS

| | | | |
|---|---|---|---|
| 6,709,941 B2* | 3/2004 | Fujimaki | 438/341 |
| 2003/0186562 A1* | 10/2003 | Fujimaki | 438/791 |
| 2007/0004134 A1* | 1/2007 | Vora | 438/257 |
| 2008/0012066 A1* | 1/2008 | Lin | 257/329 |
| 2009/0039407 A1* | 2/2009 | Vora | 257/316 |
| 2009/0159965 A1* | 6/2009 | Jung | 257/331 |

FOREIGN PATENT DOCUMENTS

| KR | 10-1993-0022603 | 11/1993 |
|---|---|---|
| KR | 10-0242379 | 11/1999 |
| KR | 10-2004-0014841 | 2/2004 |
| KR | 1020060005041 | 1/2006 |

OTHER PUBLICATIONS

A machine translation of Korean publication No. 10-2004-0014841.*

Notice of Rejection for Korean Patent Application No. 10-2008-0001890, dated Sep. 17, 2009.

* cited by examiner

*Primary Examiner*—Walter L Lindsay, Jr.
(74) *Attorney, Agent, or Firm*—Marshall, Gerstein & Borun LLP

(57) ABSTRACT

A method of manufacturing a semiconductor device, particularly a vertical transistor, including forming a contact hole and forming a pillar using an epitaxial growth process.

15 Claims, 6 Drawing Sheets

( i )

( ii )

MANUFACTURING METHOD OF SEMICONDUCTOR DEVICE

CROSS-REFERENCE TO RELATED APPLICATION

The priority of Korean patent application no. 10-2008-0001890, filed on Jan. 7, 2008, the disclosure of which is incorporated by reference in its entirety, is claimed.

BACKGROUND OF THE INVENTION

1. Field of the Invention

The invention relates to a manufacturing method of semiconductor device having a vertical transistor.

2. Brief Description of Related Technology

Recently, in semiconductor devices like Dynamic random access memory (DRAM), technology capable of increasing the integration density of semiconductor devices by forming more transistors in a restricted area is required. For this, vertical transistor technology is suggested.

Vertical transistor technology has come into the spot light as a transistor of choice for various devices as well as for DRAM since it can use a restricted area more efficiently by using a vertical channel.

A vertical transistor can be a very efficient means for short channel effect (SCE) since it can maintain a fixed channel length regardless of the reduction of the area of element. Particularly, the surrounding gate can maximize the gate controllability to improve the SCE, while providing excellent operating current characteristics since the area where the current flows is large.

However, when the surrounding gate of the vertical transistor is formed, the pillar can fall down due to a high aspect ratio.

FIGS. 1a to 1e are cross sectional views showing a typical method of manufacturing semiconductor devices having a vertical transistor.

Referring to FIG. 1a, a hard mask pattern 15 defining the pillar region is formed on a semiconductor substrate 10, while the semiconductor substrate 10 is etched using the hard mask pattern 15 as an etch mask, such that an upper portion of pillar 20 is formed.

Referring to FIG. 1b, an oxide layer 30 for forming a spacer is formed on the resultant structure of FIG. 1a.

Referring to FIG. 1c, a spacer 35 is formed by performing an etch back process on the resultant structure of FIG. 1b, and a lower portion of pillar 40 connected with the upper portion of pillar 20 is formed by etching the semiconductor substrate 10 using the spacer 35 as an etch mask.

Referring to FIG. 1d, a channel region 45 is formed by performing an isotropic etching on the side wall of the lower portion of pillar 40 using the spacer 35 as an etch barrier.

Referring to FIG. 1e, after a gate material 50 is formed on the resultant structure of FIG. 1d, and the gate material 50 is dry etched using the hard mask pattern 15 and the upper portion of pillar 20 as an etch mask, so that a surrounding gate which surrounds the channel region 45 is formed.

In the meantime, when the channel region 45 is formed, the pillar is susceptible to falling down since the channel region 45 is slimmer than the upper portion of pillar 20. In addition, when the etch process for the gate material is not performed, a short circuit phenomenon has been found to occur often between the surrounding gates.

SUMMARY OF THE INVENTION

Embodiments of the present invention are directed to increase the yield and integration density of a semiconductor device by improving the method of manufacturing a vertical transistor.

According to an embodiment of the present invention, a method of manufacturing a semiconductor device includes selectively etching a pillar region in a sacrificial layer on a semiconductor substrate to form a contact hole; forming a surrounding gate on a side wall of a lower portion of the contact hole; and growing a semiconductor substrate to fill the contact hole.

The sacrificial layer may comprise silicon oxide. The forming a surrounding gate includes: filling the contact hole with a gate material; forming a double pattern on the sacrificial layer and the gate material; and performing a double etch on the gate material with the double pattern as an etch mask in such a manner that the gate material remains only on a side wall of a lower portion of the contact hole. The forming a double pattern includes: forming a first photoresist on the sacrificial layer and the gate material; selectively removing the first photoresist, thereby forming a first photoresist pattern defining a channel region of a pillar; forming a second photoresist on the upper portion of the first photoresist pattern; and selectively removing the second photoresist, thereby forming a second photoresist pattern defining the pillar region. The performing a double etch for the gate material includes: selectively etching the gate material by using the first photoresist pattern until the semiconductor substrate is exposed; and etching the gate material to a given depth by using the second photoresist pattern. The first photoresist and the second photoresist have a different sensitivity. The first photoresist has a lower sensitivity than the second photoresist. The forming a double pattern includes: forming a first photoresist and a second photoresist on the sacrificial layer and the gate material; selectively removing the second photoresist, thereby forming a second photoresist pattern defining the pillar region; and selectively removing the first photoresist exposed by the second photoresist pattern, thereby forming a first photoresist pattern defining a channel region of a pillar. The performing a double etch on the gate material includes: selectively etching the gate material by using the first photoresist pattern until the semiconductor substrate is exposed; and etching the gate material to a given depth by using the second photoresist pattern. The first photoresist and the second photoresist have a different sensitivity. The first photoresist has a lower sensitivity than the second photoresist. The gate material includes doped silicon (Si) or silicon-germanium (SiGe). The growth of the semiconductor substrate can be performed by an epitaxial growth process. In accordance with one embodiment of the present invention, a method of manufacturing a semiconductor device optionally further includes the step of forming a source/drain region by implanting impurity ions into an upper portion of the grown semiconductor substrate. In accordance with another embodiment of the present invention, a method of manufacturing a semiconductor device optionally further includes eliminating the sacrificial layer and forming a buried bit line after eliminating the sacrificial layer.

DETAILED DESCRIPTION

Figure 1A:
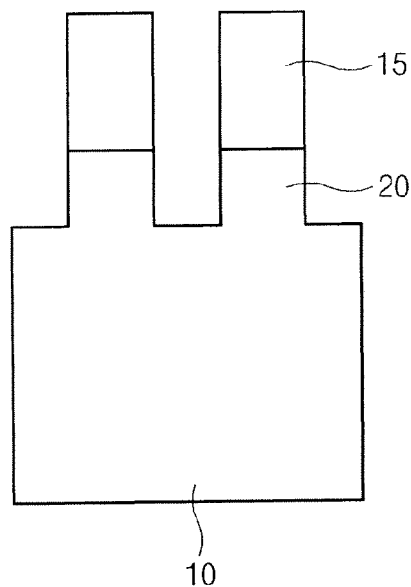
FIGS. 1a to 1e are cross sectional views showing a prior art method of manufacturing a semiconductor device.
Figure 1B:
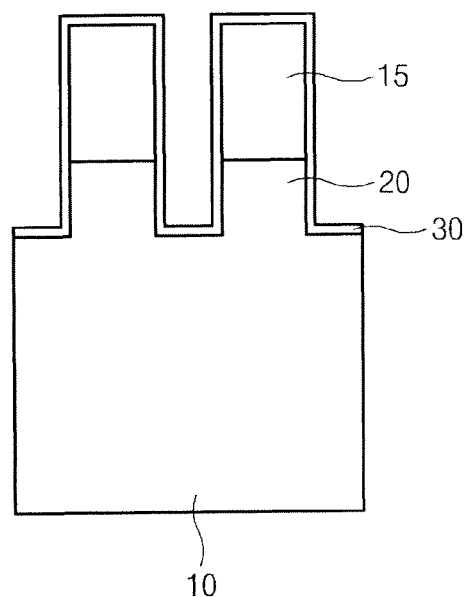
Figure 1C:
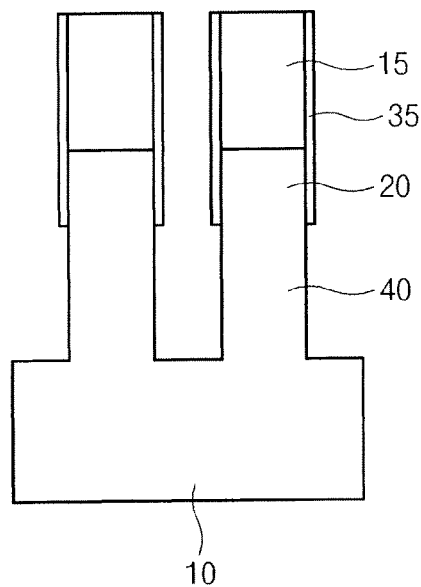
Figure 1D:
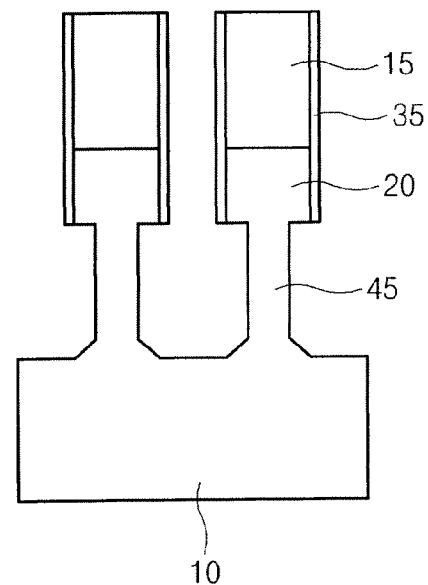
Figure 1E:
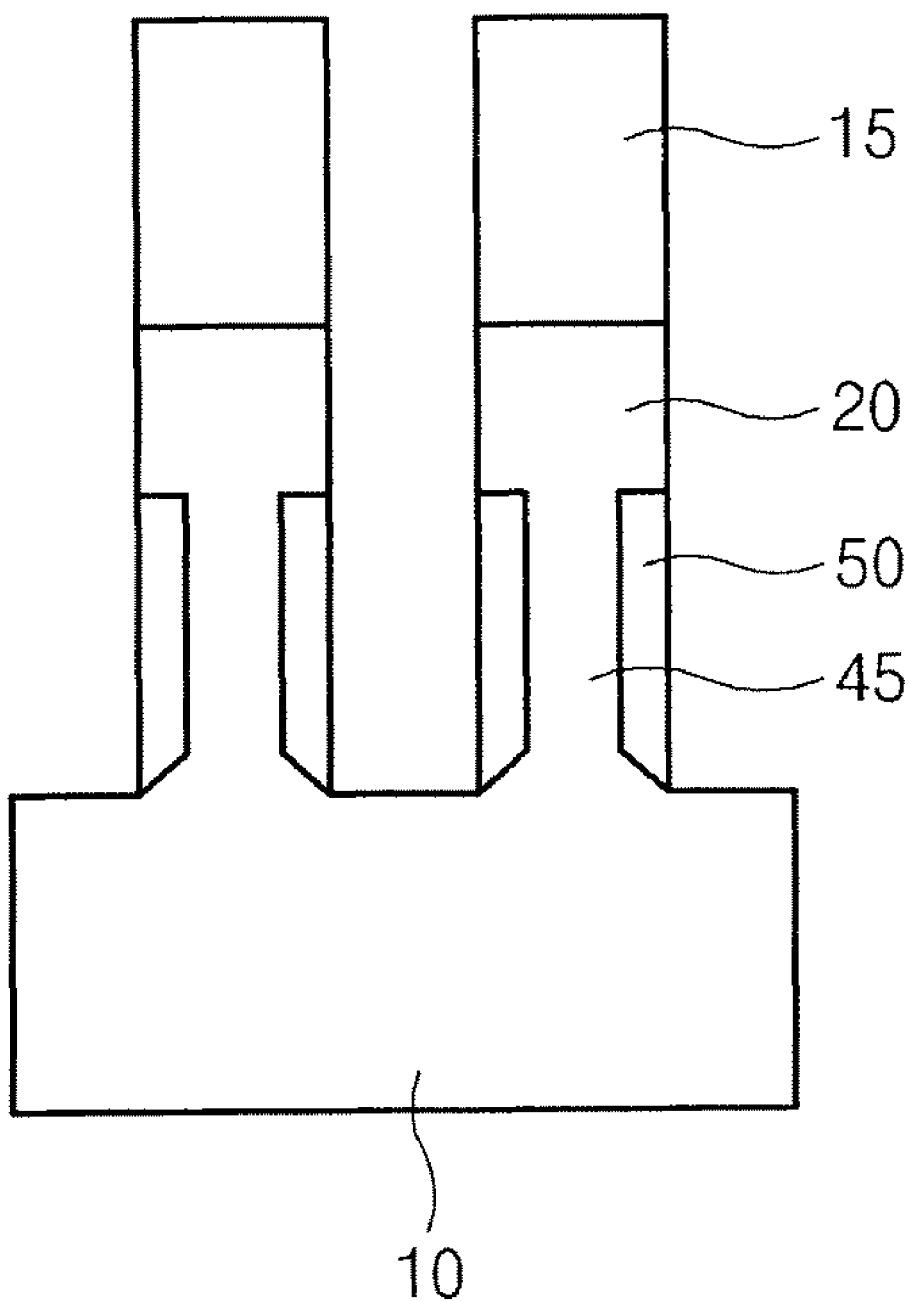
Figure 2A:
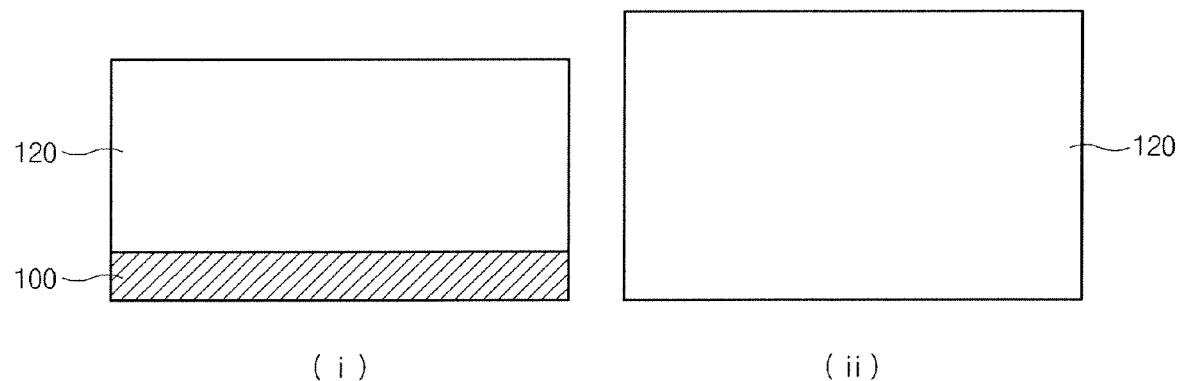
FIGS. 2a to 2f are cross-sectional views and plane views showing a method of manufacturing a semiconductor device according to an embodiment of the invention.

FIGS. 2a to 2f are drawings showing the method of manufacturing a semiconductor device according to an embodiment of the present invention, wherein FIGS. 2a(i) to 2f(i) are drawings showing cross-sectional views of a vertical transistor, and FIGS. 2a(ii) to 2f(ii) are drawings showing plane views of the vertical transistor.

Referring to FIG. 2a, a sacrificial layer 120 is formed on a semiconductor substrate 100. Preferably, the sacrificial layer 120 comprises silicon oxide (SiO2).

Figure 2B:
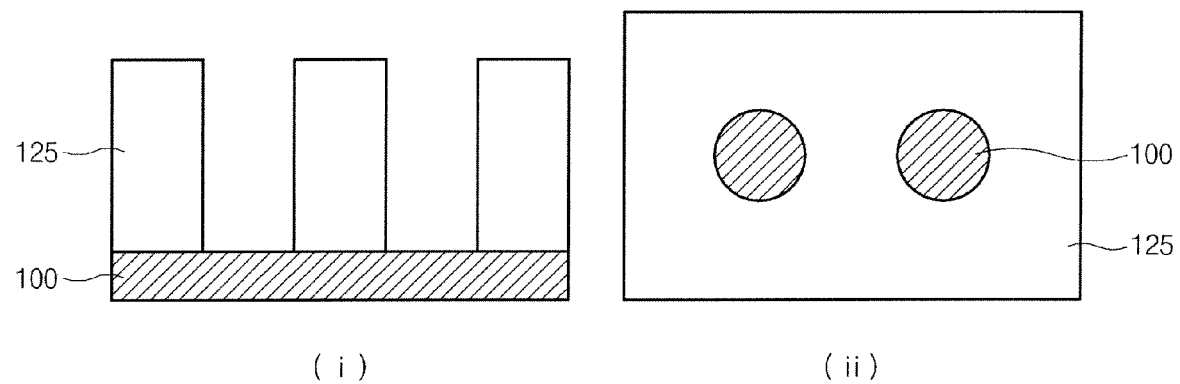

Referring to FIG. 2b, a mask pattern (not shown) exposing the region where the vertical transistor is supposed to be formed is formed on the sacrificial layer 120.

Then, a sacrificial pattern 125 is formed by selectively etching the sacrificial layer 120 with a dry etch process using the mask pattern (not shown) until the semiconductor substrate 100 is exposed, thereby defining a pillar region of a vertical transistor. And, then the mask pattern is eliminated.

Figure 2C:
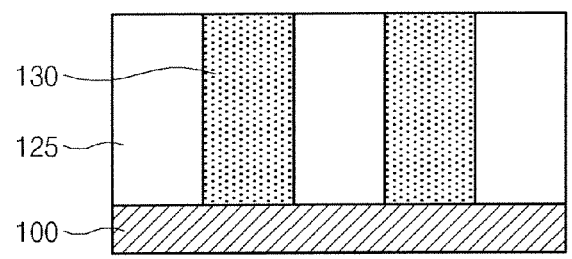
Figure 2C:
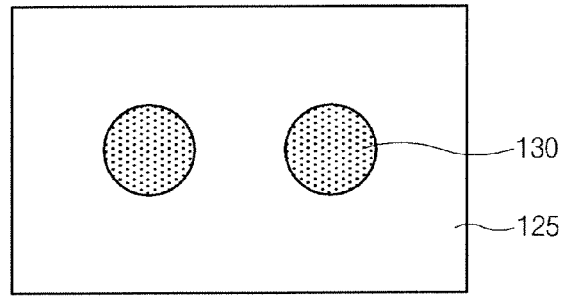

Referring to FIG. 2c, a gate material 130 for forming the surrounding gate is filled into the pillar region. Suitable gate materials 130 include doped Si and SiGe. In order to eliminate the step difference of the gate material 130, it is preferable that the upper portion of the gate material 130 is planarized through a chemical mechanical polishing process.

Figure 2D:
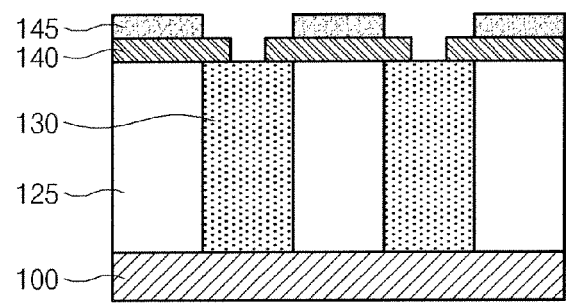
Figure 2D:
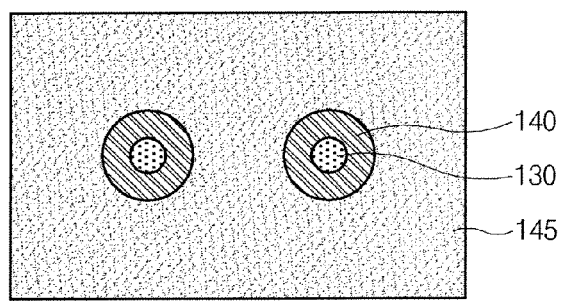

Referring to FIG. 2d, a first photoresist layer is formed on the gate material 130 and the sacrificial pattern 125. The first photoresist layer is exposed to light and developed by using a mask (not shown) so that a first photoresist pattern 140 is formed, the first photoresist pattern defining a channel region of the vertical transistor.

Then, after a second photoresist layer is formed on the first photoresist pattern 140 and the gate material 130, the second photoresist layer is exposed to light and developed by using a mask (not shown) so that a second photoresist pattern 145 is formed, the second photoresist pattern defining the pillar region. That is, a double photoresist pattern in which the two photoresist patterns define different regions and have a step structure is formed.

The first photoresist pattern 140 has a low sensitivity. That is, the sensitivity of the first photoresist pattern 140 is lower than the second photoresist pattern 145.

Because of the difference in sensitivities of the first and second photoresists, the first photoresist pattern 140 and the second photoresist pattern 145 can be formed by using a double exposure. For instance, after the first photoresist layer and the second photoresist layer having different sensitivities are deposited, the second photoresist layer can be selectively eliminated to firstly form the second photoresist pattern. Thereafter, the first photoresist pattern is formed by selectively eliminating the first photoresist layer, which has been exposed by formation of the second photoresist pattern.

Figure 2E:
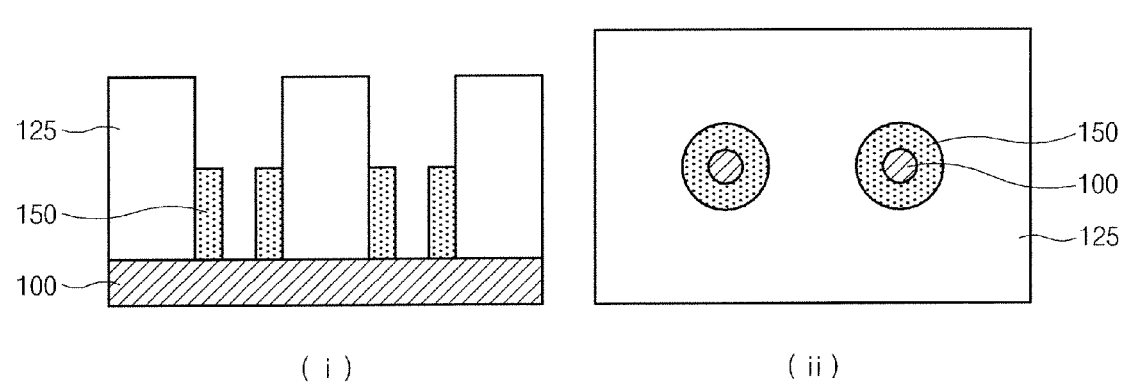

Referring to FIG. 2e, the first photoresist pattern 140 and the second photoresist pattern 145 are sequentially used as etch masks to perform a double etch for the gate material 130, so that a surrounding gate 150 is formed.

That is, the gate material 130 is etched with the first photoresist pattern 140 as an etch mask until the semiconductor substrate 100 is exposed. Then, a part of the first photoresist pattern 140 exposed by the second photoresist pattern 145 is removed and the gate material 130 is etched to a given depth with the second photoresist pattern 145 as an etch mask, so that the surrounding gate 150 is formed on a side wall of a lower portion of the contact hole.

Figure 2F:
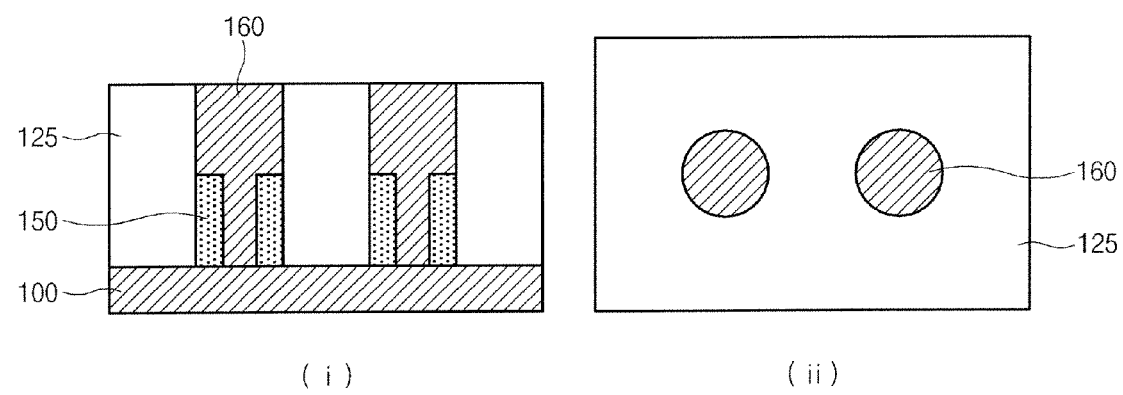

Referring to FIG. 2f, a layer 160 filling the contact hole is formed by performing an epitaxial growth process by exposing the semiconductor substrate 100 between the surrounding gates 150 as a seed. Such epitaxial growth layer 160 becomes the pillar of the vertical transistor.

Then, impurity ions are optionally implanted into an upper portion of the epitaxial growth layer 160 to form a source/drain region.

Then, the sacrificial pattern 125 can be eliminated, and a buried bit line can be formed and capacitor formation can be conducted in subsequent processes. The buried bit line and capacitor formation processes can be carried out as is conventionally known.

By forming the pillar using a silicon epitaxial growth process after firstly forming the surrounding gate, as described herein, the invention can prevent the problem that the pillar falls down in the process of forming the surrounding gate in the channel region. Accordingly, the yield of the manufacturing process of semiconductor device can be increased. Furthermore, by using such method, the critical dimension of the pillar can be reduced, such that the integration density of semiconductor device can be improved.

It will be apparent to those skilled in the art that various modifications and variations can be made without departing from the spirit or scope of the invention. Thus, it is intended that the present invention cover these modifications and variations provided they come within the scope of the appended claims and their equivalents.

What is claimed is:

1. A method of manufacturing a semiconductor device, comprising:
   selectively etching a pillar region in a sacrificial layer on a semiconductor substrate to form a contact hole;
   forming a surrounding gate on a side wall of a lower portion of the contact hole; and
   forming a growth layer in the contact hole to bury the surrounding gate.

2. The method of claim 1, wherein the sacrificial layer comprises silicon oxide.

3. The method of claim 1, wherein forming the surrounding gate comprises:
   filling the contact hole with a gate material;
   forming a double pattern on the sacrificial layer and the gate material; and
   performing a double etch on the gate material using the double pattern as an etch mask in such a manner that the gate material remains only on a side wall of the lower portion of the contact hole.

4. The method of claim 3, wherein forming a double pattern comprises:
   forming a first photoresist on the sacrificial layer and the gate material;
   selectively removing the first photoresist, thereby forming a first photoresist pattern defining a channel region of a pillar;
   forming a second photoresist on the first photoresist pattern; and
   selectively removing the second photoresist, thereby forming a second photoresist pattern defining the pillar region.

5. The method of claim 4, wherein performing a double etch on the gate material comprises:
   selectively etching the gate material by using the first photoresist pattern until the semiconductor substrate is exposed; and etching the gate material to a given depth by using the second photoresist pattern.

6. The method of claim 4, wherein the first photoresist and the second photoresist have different sensitivities.

7. The method of claim 6, wherein the first photoresist has a lower sensitivity than the second photoresist.

8. The method of claim 3, wherein forming a double pattern comprises:

forming a first photoresist and a second photoresist on the sacrificial layer and the gate material;

selectively removing the second photoresist, thereby forming a second photoresist pattern defining a pillar region; and selectively removing the first photoresist exposed by the first photoresist pattern, thereby forming a first photoresist pattern defining a channel region of a pillar.

9. The method of claim 8, wherein performing a double etch on the gate material comprises:

selectively etching the gate material by using the first photoresist pattern until the semiconductor substrate is exposed; and etching the gate material to a given depth by using the second photoresist pattern.

10. The method of claim 8, wherein the first photoresist and the second photoresist have different sensitivities.

11. The method of claim 10, wherein the first photoresist has a lower sensitivity than the second photoresist.

12. The method of claim 10, wherein the gate material comprises a doped silicon material or silicon-germanium.

13. The method of claim 1, wherein the growth layer includes an epitaxial growth layer.

14. The method of claim 1, further comprising the step of forming a source/drain region by implanting impurity ions into an upper portion of the grown semiconductor substrate.

15. The method of claim 1, further comprising removing the sacrificial layer and forming a buried bit line after eliminating the sacrificial layer.

* * * * *